United States Patent
Liang et al.

(10) Patent No.: US 8,786,513 B2
(45) Date of Patent: Jul. 22, 2014

(54) DEVICE AND GROUNDING DEVICE FOR ENHANCING EMS AND WIRELESS COMMUNICATION DEVICE

(75) Inventors: Hsiao-Pin Liang, Taichung (TW); Dau-Chyrh Chang, Taipei (TW); Cheng-Wei Chen, New Taipei (TW)

(73) Assignee: Climax Technology Co., Ltd., Taipei (TW)

( * ) Notice: Subject to any disclaimer, the term of this patent is extended or adjusted under 35 U.S.C. 154(b) by 216 days.

(21) Appl. No.: 13/566,383

(22) Filed: Aug. 3, 2012

(65) Prior Publication Data

US 2013/0169487 A1    Jul. 4, 2013

(30) Foreign Application Priority Data

Jan. 3, 2012   (TW) .............................. 101100137 A

(51) Int. Cl.
*H01Q 1/48* (2006.01)
(52) U.S. Cl.
USPC ............................ 343/848; 343/846; 343/702
(58) Field of Classification Search
USPC ......................................... 343/846, 848, 702
See application file for complete search history.

(56) References Cited

U.S. PATENT DOCUMENTS 8,432,319 B2 * 4/2013 Yukimoto et al. ..... 343/700 MS

OTHER PUBLICATIONS

Liang, H.B., et al.; "The Phenomenon and Solution of EMI Noise Due to Edge Current Effect of High Efficiency On-board PIFA;" IEEE; Aug. 2011; pp. 191-195.

* cited by examiner

*Primary Examiner* — Hoang V Nguyen
(74) *Attorney, Agent, or Firm* — McClure, Qualey & Rodack, LLP

(57) ABSTRACT

A device for enhancing electromagnetic susceptibility comprises a first bridge. The first bridge is near to a first trace of a differential pair routing and electrically connects an RF grounding with an analog grounding. The RF grounding and the analog grounding are separated. The differential pair routing transmits signals between an RF circuit and an analog circuit. The first trace of the differential pair routing is closer to an antenna coupled to the RF grounding than a second trace of the differential pair routing. The RF circuit is coupled to the RF grounding, and the analog circuit is coupled to the analog grounding.

9 Claims, 8 Drawing Sheets

DEVICE AND GROUNDING DEVICE FOR ENHANCING EMS AND WIRELESS COMMUNICATION DEVICE

CROSS REFERENCE TO RELATED APPLICATIONS

This Application claims priority of Taiwan Patent Application No. 101100137, filed on Jan. 3, 2012, the entirety of which is incorporated by reference herein.

BACKGROUND OF THE INVENTION

1. Field of the Invention

The invention relates to wireless communication device and more particularly to a wireless communication device having separated groundings.

2. Description of the Related Art

For system-level layout design, good grounding is important. Generally, in order to suppress noise, the simplest and most effective way is to separate groundings with different properties, for example, groundings for analog and digital portions of circuitry. On the other hand, for signal trace routing, in order to avoid being influenced by EMI (Electromagnetic Interference), a differential architecture is a commonly used structure to improve EMS (Electromagnetic Susceptibility) of a system. For antenna design engineers, enhancing the efficiency of antennas is an important task. However, too much radiation power sometimes causes trouble to the system. For example, enhancing the antenna efficiency may result in enhancing EMI noise owing to radiation or conduction.

FIG. 1(a) shows a top view of a wireless communication device 10. An RF (Radio Frequency) grounding 120 and an analog grounding 130 are provided on a printed circuit board 100. There's a moat 110 between the RF grounding 120 and the analog grounding 130, so the RF grounding 120 and the analog grounding 130 are separated groundings. FIG. 1(a) only shows a portion of the wireless communication device 10. An on-board antenna, such as a printed inverted-F antenna 140, is provided on the printed circuit board 100 and coupled to the RF grounding 120. FIG. 1(b) is a partial enlarged view of FIG. 1(a). Differential pair routings 150 and 160 used to transmit signals are wiring devices with two traces. Parts of the differential pair routings 150 and 160 are in the same layer as the RF grounding 120 and the analog grounding 130. Other parts of the differential pair routings 150 and 160 enter other layers by drilling so as to connect with circuits or other modules on the other layers, such as an RF module. The on-board antenna on the circuit board induces strong edge current. When increasing the efficiency of antennas, the current density becomes larger on the groundings. The current energy, especially the current energy along the edges of groundings, couples the conductive EMI energy to the differential pair routings 150 and 160 via stray capacitance between groundings and differential pair routings. In the differential pair routing 150, the trace 150-a, which is closer to the antenna 140, has more EMI noise than the other trace 150-b, and thus magnitudes of EMI noise on two traces of the differential pair routing 150 are unequal. A colored figure in FIG. 5 is a simulation diagram of current density of the wireless communication device in FIG. 1(a) and FIG. 1(b). The left part of the colored figure in FIG. 5 corresponds to the structure in FIG. 1(a) and the right part of the colored figure in FIG. 5 corresponds to the structure in FIG. 1(b). As shown in right part of the colored figure in FIG. 5, red parts representing higher current density are drawn near the trace 150-a, which is closer to the antenna 140 in the differential pair routing. Orange parts representing second high current density are drawn near the other trace 150-b. Therefore, higher current density is distributed in the trace 150-a, which is closer to the antenna 140 in the differential pair routing, than in the other trace 150-b. Furthermore, as shown in FIG. 2, simulated voltage response between trances of the differential pair routing has bigger fluctuations, and hence the EMI noise can't be diminished effectively through differential pair routings.

BRIEF SUMMARY OF THE INVENTION

In view of this, a bridge is arranged near to a differential pair routing to reduce EMI noise of the differential pair routing and hence improve immunity against EMI.

In one embodiment, the invention provides a device for enhancing electromagnetic susceptibility, comprising: a first bridge, arranged near to a first trace of a differential pair routing and electrically connecting a radio frequency (RF) grounding with a analog grounding, wherein the RF grounding and the analog grounding are separated, the differential pair routing transmits signals between an RF circuit and an analog circuit, the first trace of the differential pair routing is closer to an antenna coupled to the RF grounding than a second trace of the differential pair routing, the RF circuit is coupled to the RF grounding, and the analog circuit is coupled to the analog grounding.

In another embodiment, the invention provides a grounding device for enhancing electromagnetic susceptibility, comprising: an RF grounding; an analog grounding, separated from the RF grounding; and a first bridge, arranged near to a first trace of a differential pair routing and electrically connecting the RF grounding with the analog grounding, wherein the differential pair routing transmits signals between an RF circuit and an analog circuit, the first trace of the differential pair routing is closer to an antenna coupled to the RF grounding than a second trace of the differential pair routing, the RF circuit is coupled to the RF grounding, and the analog circuit is coupled to the analog grounding.

In still another embodiment, the invention provides a wireless communication device, comprising: a circuit board, wherein a layer of the circuit board comprises an RF grounding and an analog grounding, the RF grounding and the analog grounding are separated, the RF grounding is coupled to an RF circuit, and the analog grounding is coupled to an analog circuit; an antenna, arranged on the circuit board and coupled to the RF grounding; a differential pair routing, transmitting signals between the RF circuit and the analog circuit and comprising a first trace and a second trace, wherein the first trace is closer to the antenna than the second trace; and a first bridge, arranged near to the first trace of the differential pair routing and electrically connecting the RF grounding with the analog grounding.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3A:
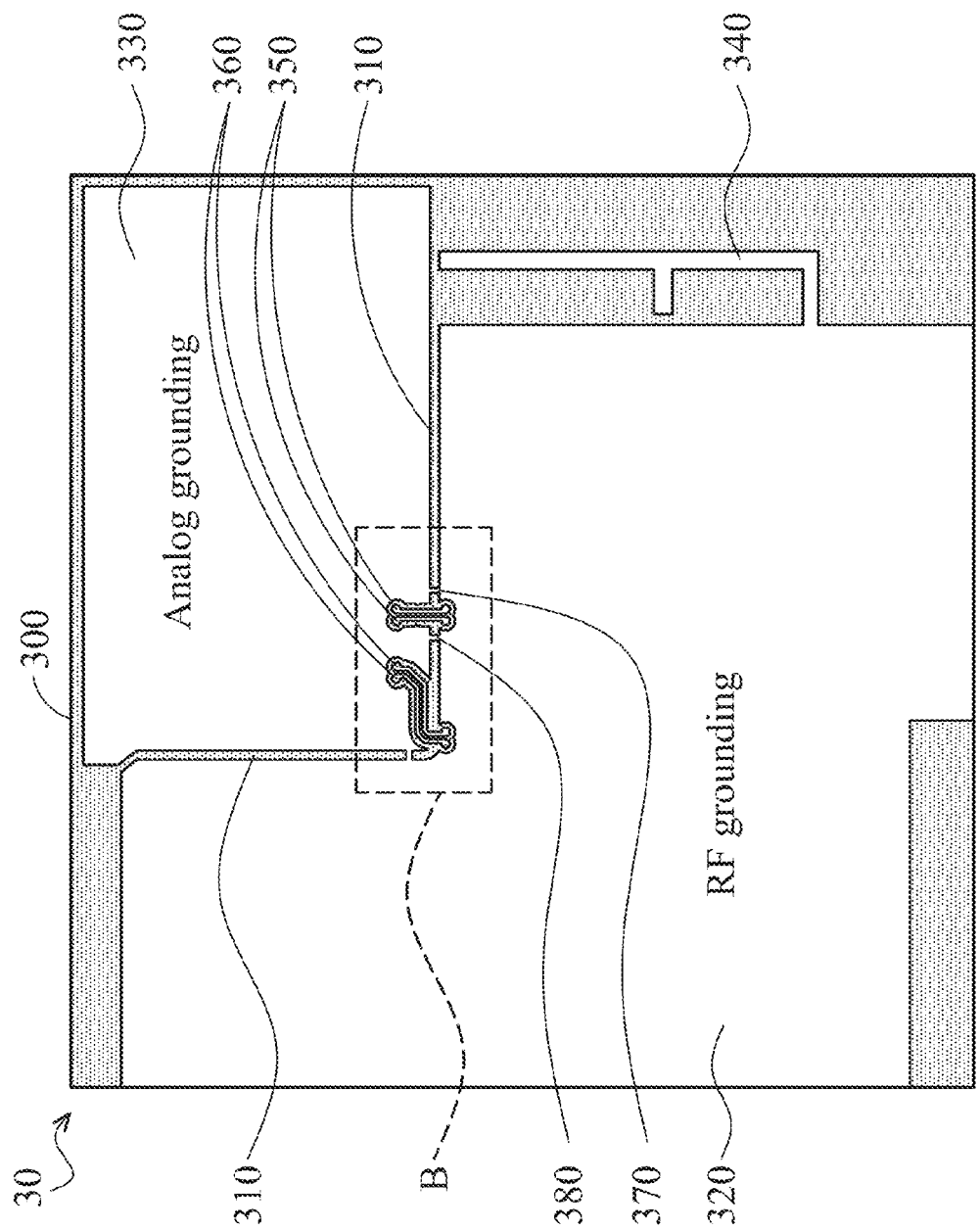
FIG. 3(a) shows a top view of a wireless communication device according to an embodiment of the invention.
Figure 3B:
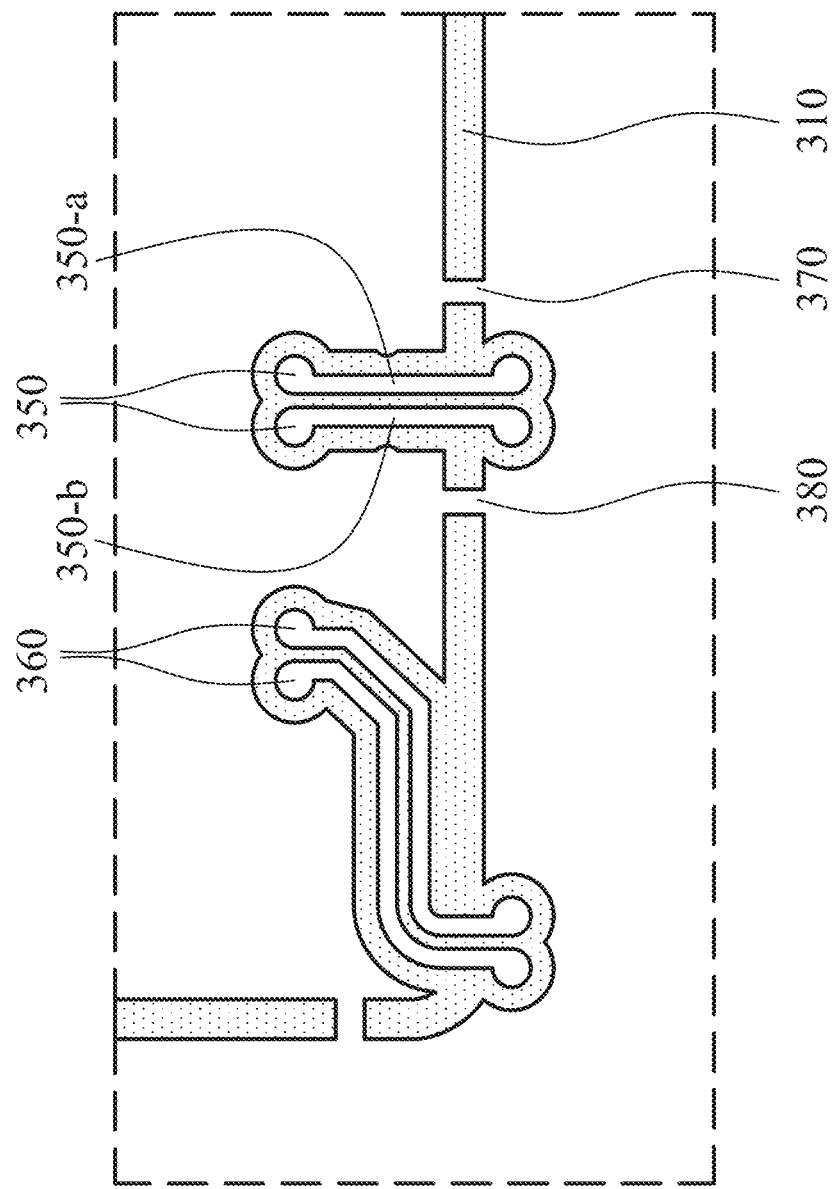
FIG. 3(b) is a partial enlarged view of FIG. 3(a)

FIG. 3(a) shows a top view of a wireless communication device 30 according to an embodiment of the invention. FIG. 3(a) only shows a portion of the wireless communication device 30. The wireless communication device 30 comprises a printed circuit board 300 having an RF grounding 320 and an analog grounding 330. There is a moat 310 between the RF grounding 320 and the analog grounding 330, and hence the RF grounding 320 and the analog grounding 330 are separated groundings. In an example, the RF grounding 320 and the analog grounding 330 are metal layers. The RF grounding 320 is coupled to an RF module (not shown) for processing RF signals. The analog grounding 330 is coupled to an analog module (not shown) for processing analog signals. A printed inverted-F antenna 340 is arranged on the printed circuit board 300 and coupled to the RF grounding 320. FIG. 3(b) is a partial enlarged view of FIG. 3(a). Differential pair routings 350 and 360 used to transmit signals are wiring devices with two traces. As shown in FIG. 3(b), parts of the differential pair routings 350 and 360 are in the same layer as the RF grounding 320 and the analog grounding 330, and other parts of the differential pair routings 350 and 360 enter other layers by drilling so as to connect with circuits or other modules on the other layers, such as an input port for analog signals in an RF module. The wireless communication device 30 further comprises bridges 370 and 380. Bridges 370 and 380 are arranged on two sides of the differential pair routing 350, respectively, and near to (but not connected to) the differential pair routing 350. In other words, bridges 370 and 380 are arranged near to two traces 350-a and 350-b of the differential pair routing 350, respectively. Bridges 370 and 380, respectively arranged on two sides of the differential pair routing 350, connect the RF grounding 320 with the analog grounding 330 and conduct strong edge current on edges of groundings, and hence the edge current is not easy to flow near to the differential pair routing. Therefore, EMI is reduced, and influence of EMI on transmitting signals is reduced remarkably so as to enhance EMS.

As described above, bridges 370 and 380 are devices for enhancing EMS. The bridge 370 is arranged near to the trace 350-a of the differential pair routing 350 and connects the RF grounding 320 with the analog grounding 330 separated from the RF grounding 320. The bridge 380 is arranged near to the trace 350-b of the differential pair routing 350 and connects the RF grounding 320 with the analog grounding 330 separated from the RF grounding 320. The trace 350-a is closer to the antenna 340 than the trace 350-b.

Figure 5:
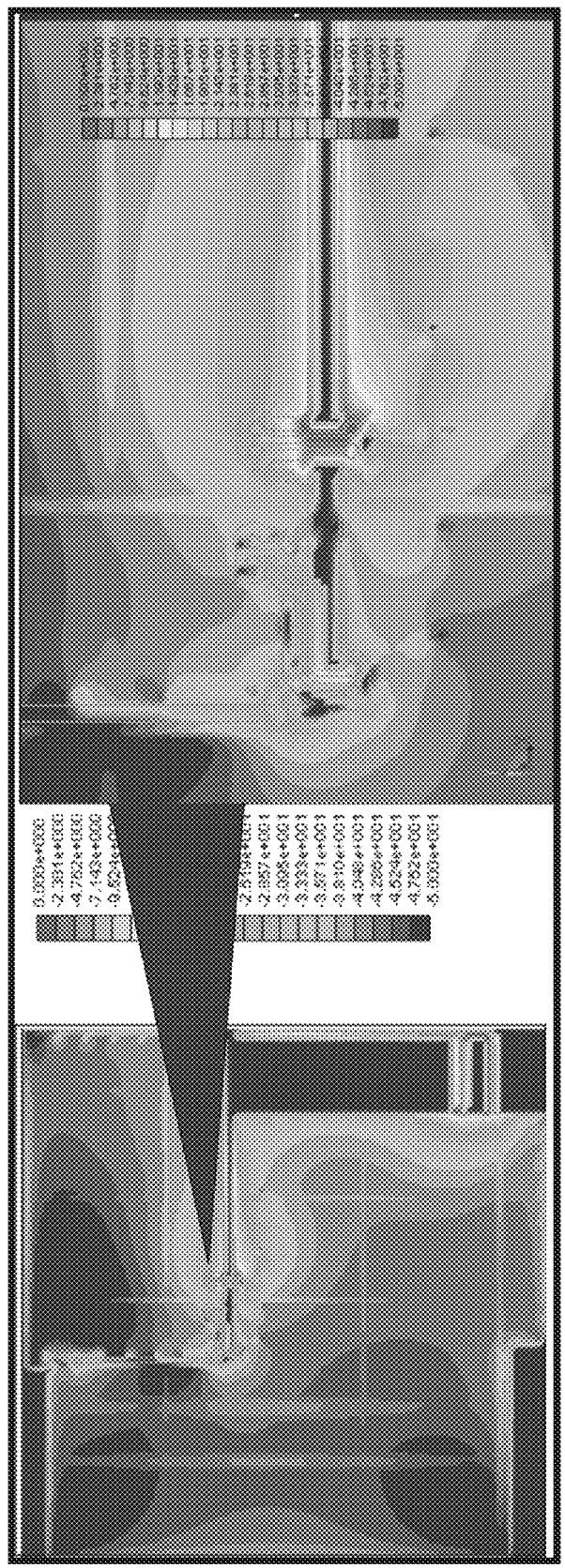
FIG. 5 is a colored simulation diagram of current density of the wireless communication device in FIG. 1(a) and FIG. 1(b)
Figure 6:
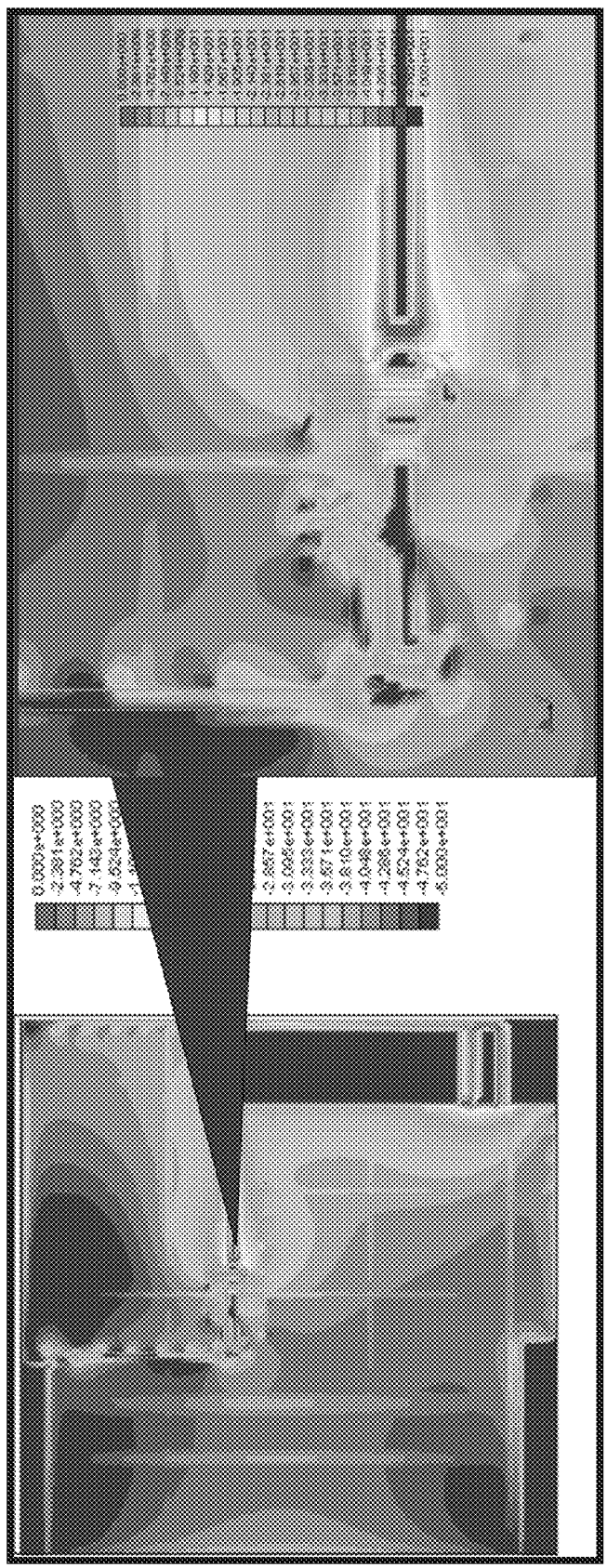
FIG. 6 is a colored simulation diagram of current density of the wireless communication device in FIG. 3(a) and FIG. 3(b).

FIG. 6 is a colored simulation diagram of current density of the wireless communication device in FIG. 3(a) and FIG. 3(b). The left part of the colored figure in FIG. 6 corresponds to the structure in FIG. 3(a) and the right part of the colored figure in FIG. 6 corresponds to the structure in FIG. 3(b). As shown in right part of the colored figure in FIG. 6, the red parts represent higher current density masses on the bridge 370 of FIG. 3(b). Because the bridge conducts the strong edge current, the current density is mainly distributed on the bridge 370 which is closer to the printed inversed-F antenna 340. Therefore, as shown in right part of the colored figure in FIG. 6, the simulation result of current density on the differential pair routing 350 is uniformly green. Hence, unlike the differential pair routing 150 having higher current density distributed on the trace 150-a than the trace 150-b, current density on the differential pair routing 350 is much more uniform than that on the differential pair routing 150 of the colored figure in FIG. 5.

Figure 1A:
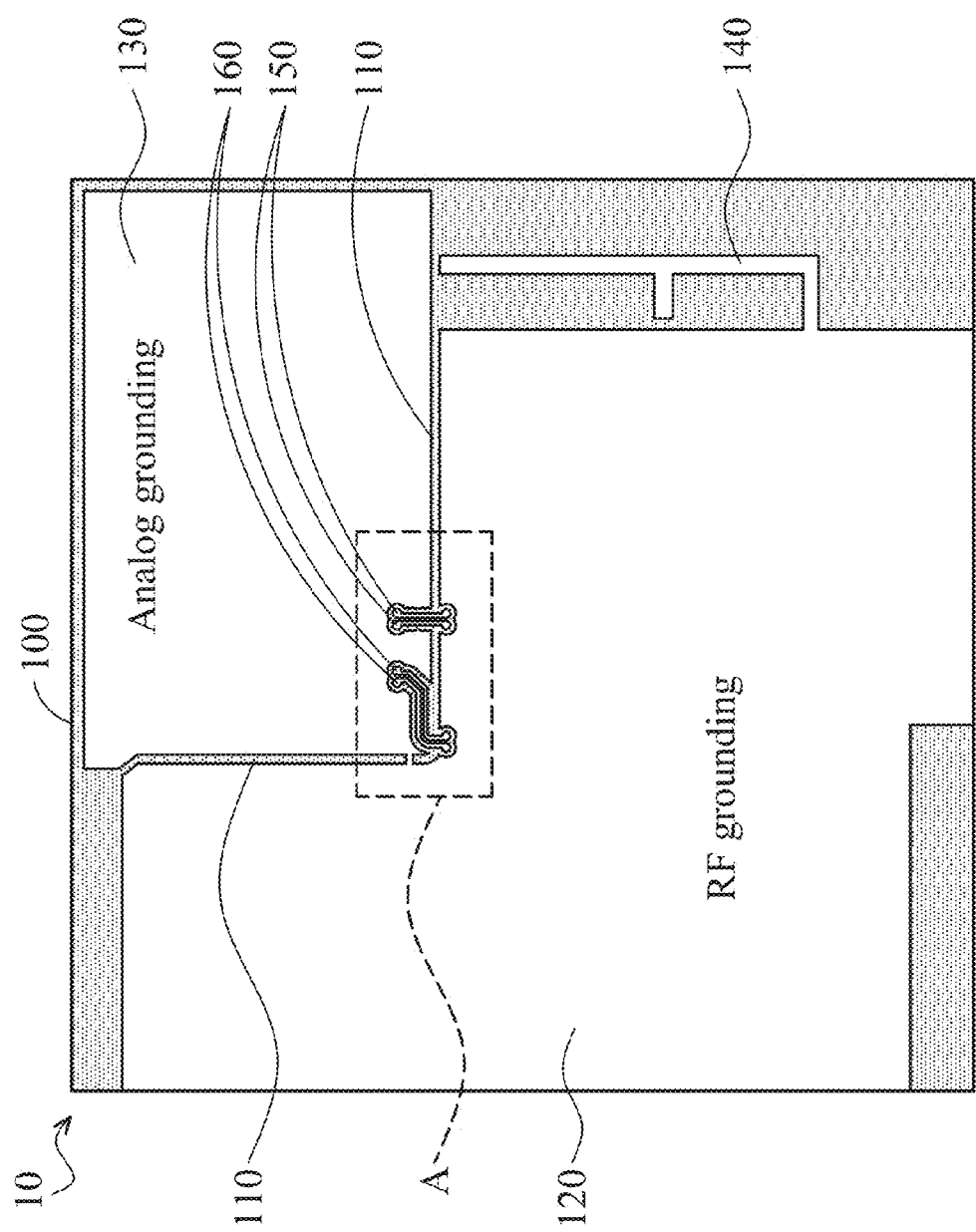
FIG. 1(a) shows a top view of a wireless communication device in prior art.
Figure 1B:
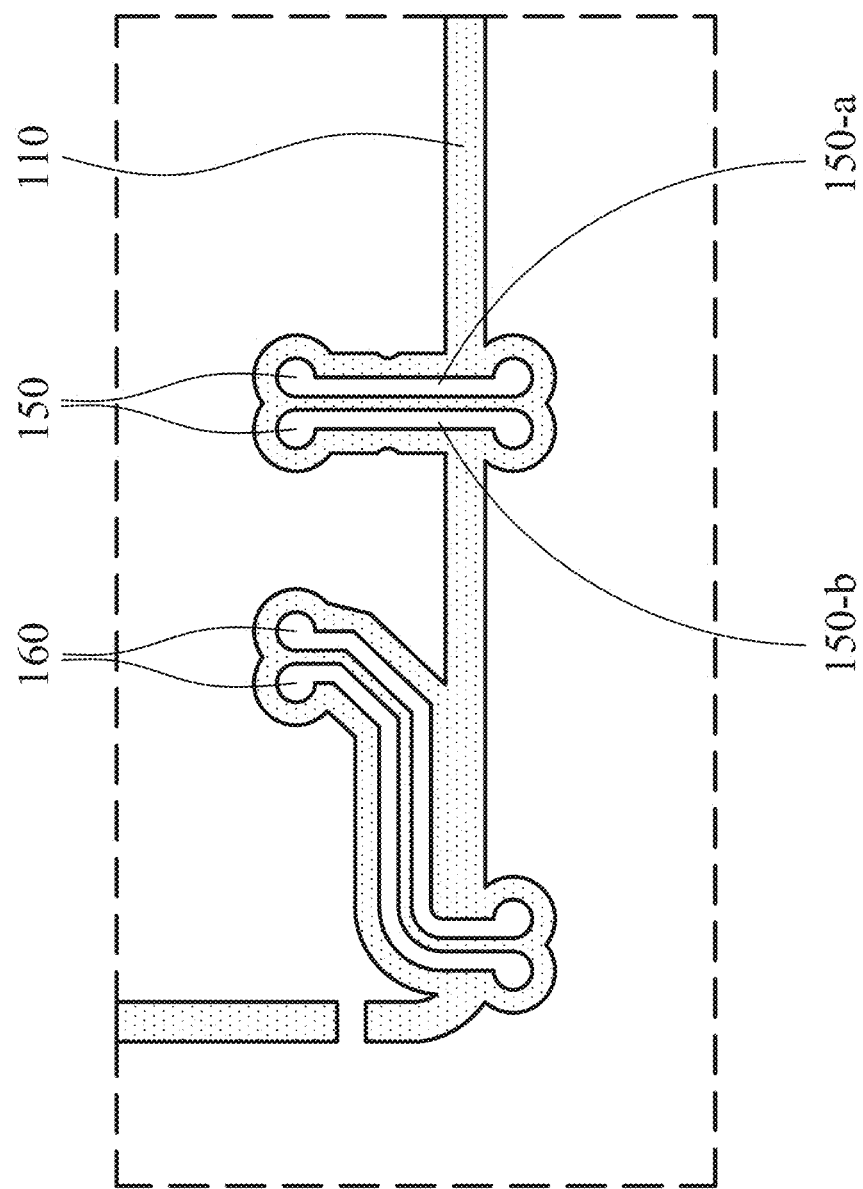
FIG. 1(b) is a partial enlarged view of FIG. 1(a)
Figure 2:
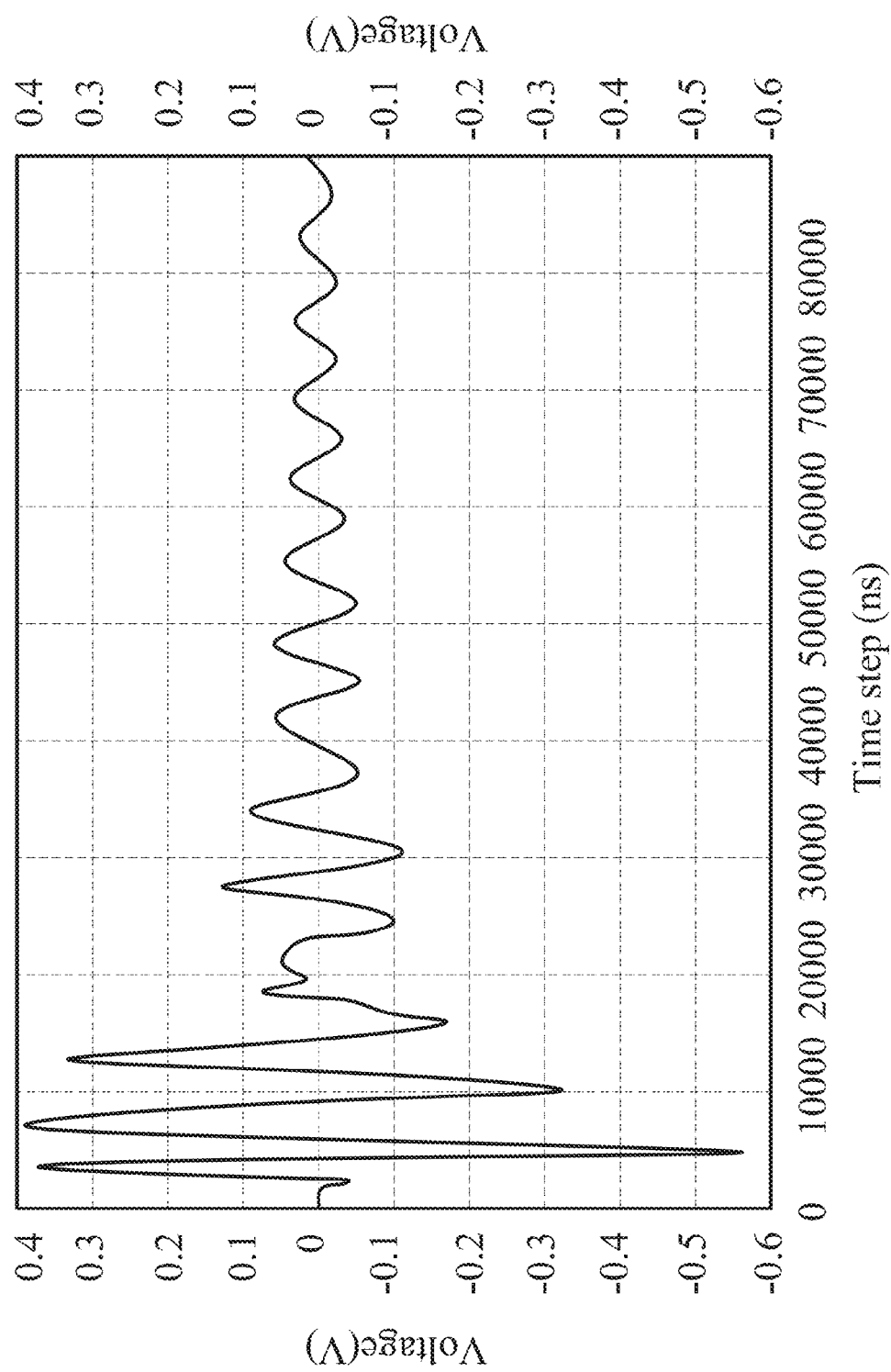
FIG. 2 shows a simulation diagram of voltage response of a differential pair routing of the wireless communication device in prior art.
Figure 4:
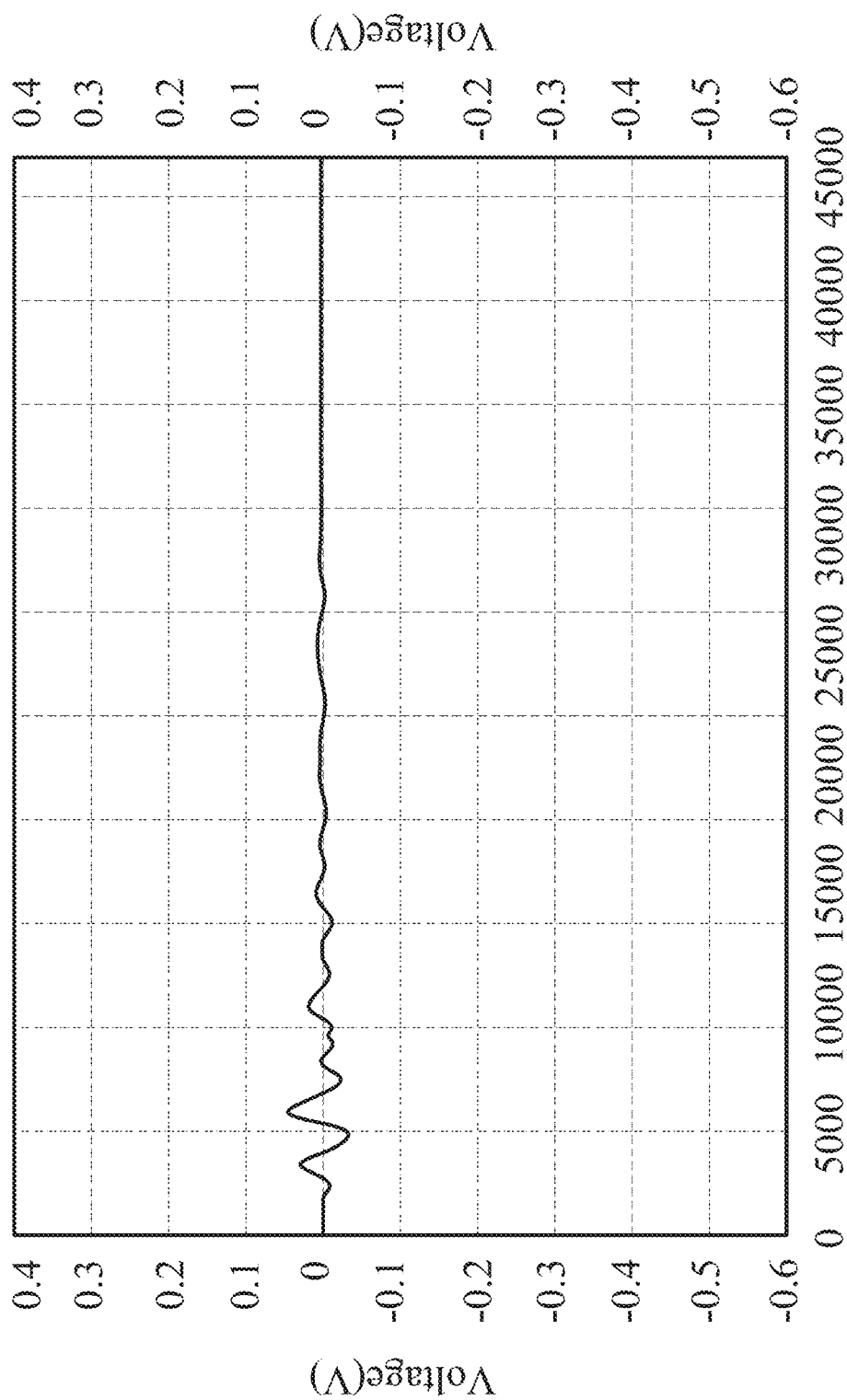
FIG. 4 shows a simulation diagram of voltage response of a differential pair routing of the wireless communication device according to an embodiment of the invention.

FIG. 4 shows a simulation diagram of voltage response of the differential pair routing of the wireless communication device 30 in FIG. 3(a). The simulation simulates the voltage difference between the differential pair routings as time steps go on. The unit of time steps is a nanosecond (ns). As shown in FIG. 4, the fluctuation of voltage response in FIG. 4 is much less than that in FIG. 2.

In the embodiment, bridges are arranged on two sides of the differential pair routing 350, and thus the RF grounding 320, the analog grounding 250 and bridges 370 and 380, which are all conductive materials, surround (but not contact with) the differential pair routing 350 to prevent EMI from being coupled to the differential pair routing 350, and thus EMI on signals transmitted by the differential pair routing 350 is effectively diminished. In another embodiment, only the side of the differential pair routing 350 which is closer to the printed inverted-F antenna 340 has a bridge, that is, the bridge 370. In other words, the bridge is arranged near to the trace 350-a of the differential pair routing 350. Note that bridges 370 and 380 don't have to be in the same layer as the RF grounding 320 and the analog grounding 330. Bridges 370 and 380 are arranged near to the differential pair routing 350. When the bridges 370 and 380 are in the same layer as the RF grounding 320 and the analog grounding 330, printed circuit technology may be used to form the bridges 370 and 380. When the bridges 370 and 380 are not in the same layer as the RF grounding 320 and the analog grounding 330, the bridges 370 and 380 are connectors with conductive material to connect the RF grounding 320 with the analog grounding 330.

As described above, arranging bridges on two sides of the differential pair routing and near to the differential pair routing effectively diminishes EMI as shown from the colored simulation diagram in FIG. 5 and FIG. 4.

Though above embodiments are illustrated with an example of the RF module and the analog module, a person skilled in the art is able to apply the invention to an RF circuit and an analog circuit.

In the specification, simulated results of FIG. 2, FIG. 4, FIG. 5, FIG. 6 are simulated by a 3D EM simulator GEMS of 2COMU.

The wireless communication device in the embodiments of the invention is especially applied to a wireless communication device performing wireless communication and analog signal processing at the same time, such as a two-way voice communication device.

Embodiments of the invention especially applies to wireless communication devices implementing wireless communication and processing analog signals at the same time, such as a two-way voice communication device, like a wireless intercom device.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A device for enhancing electromagnetic susceptibility, comprising:
   a first bridge, arranged near to a first trace of a differential pair routing and electrically connecting a radio frequency (RF) grounding with a analog grounding, wherein the RF grounding and the analog grounding are separated, the differential pair routing transmits signals between an RF circuit and an analog circuit, the first trace of the differential pair routing is closer to an antenna coupled to the RF grounding than a second trace of the differential pair routing, the RF circuit is coupled to the RF grounding, and the analog circuit is coupled to the analog grounding.

2. The device as claimed in claim 1, further comprising:
   a second bridge, arranged near to the second trace of the differential pair routing and electrically connecting the RF grounding with the analog grounding.

3. A grounding device for enhancing electromagnetic susceptibility, comprising:
   an RF grounding;
   an analog grounding, separated from the RF grounding; and
   a first bridge, arranged near to a first trace of a differential pair routing and electrically connecting the RF grounding with the analog grounding, wherein the differential pair routing transmits signals between an RF circuit and an analog circuit, the first trace of the differential pair routing is closer to an antenna coupled to the RF grounding than a second trace of the differential pair routing, the RF circuit is coupled to the RF grounding, and the analog circuit is coupled to the analog grounding.

4. The device as claimed in claim 3, further comprising:
   a second bridge, arranged near to the second trace of the differential pair routing and electrically connecting the RF grounding with the analog grounding.

5. A wireless communication device, comprising:
   a circuit board, wherein a layer of the circuit board comprises an RF grounding and an analog grounding, the RF grounding and the analog grounding are separated, the RF grounding is coupled to an RF circuit, and the analog grounding is coupled to an analog circuit;
   an antenna, arranged on the circuit board and coupled to the RF grounding;
   a differential pair routing, transmitting signals between the RF circuit and the analog circuit and comprising a first trace and a second trace, wherein the first trace is closer to the antenna than the second trace; and
   a first bridge, arranged near to the first trace of the differential pair routing and electrically connecting the RF grounding with the analog grounding.

6. The wireless communication device as claimed in claim 5, further comprising:
   a second bridge, arranged near to the second trace of the differential pair routing and electrically connecting the RF grounding with the analog grounding.

7. The wireless communication device as claimed in claim 6, wherein the antenna is a printed inverted-F antenna.

8. The wireless communication device as claimed in claim 7, wherein the RF circuit is an integrated RF module and the analog circuit is an integrated analog module.

9. The wireless communication device as claimed in claim 5, wherein the circuit board is a printed circuit board.

* * * * *